United States Patent
Fujii et al.

(10) Patent No.: US 6,969,264 B2
(45) Date of Patent: Nov. 29, 2005

(54) TRANSPARENT TOUCH PANEL

(75) Inventors: Shoji Fujii, Osaka (JP); Toshiharu Fukui, Nara (JP); Tetsuo Murakami, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/850,262

(22) Filed: May 20, 2004

(65) Prior Publication Data

US 2004/0238910 A1  Dec. 2, 2004

(30) Foreign Application Priority Data

May 29, 2003 (JP) .............................. 2003-152491
Jan. 19, 2004 (JP) .............................. 2004-010095

(51) Int. Cl.$^7$ ........................ H01R 12/00; H05K 1/00
(52) U.S. Cl. ........................................ 439/66; 257/433
(58) Field of Search ........................... 439/66; 257/433

(56) References Cited

U.S. PATENT DOCUMENTS

| 4,644,101 A | * | 2/1987 | Jin et al. ................. 178/18.05 |
| 5,041,183 A | * | 8/1991 | Nakamura et al. .......... 156/264 |
| 5,193,668 A | | 3/1993 | Fukuchi et al. |
| 6,847,355 B1 | * | 1/2005 | Nishikawa et al. ......... 345/173 |

FOREIGN PATENT DOCUMENTS

| JP | 04-012421 A | 1/1992 |
| JP | 2000-299033 A | 10/2000 |

* cited by examiner

Primary Examiner—Hae Moon Hyeon
(74) Attorney, Agent, or Firm—RatnerPrestia

(57) ABSTRACT

A transparent touch panel is structured by forming connecting layers that contain conductive metal powder dispersed in a resin, on ends of wiring patterns on a wiring board to which upper electrodes and lower electrodes are to be bonded. This structure can provide a transparent touch panel that ensures bonding of upper and lower substrates and the wiring board and stable electrical connection.

10 Claims, 3 Drawing Sheets

TRANSPARENT TOUCH PANEL

BACKGROUND OF THE INVENTION

1. Field of the Invention

The present invention relates to a transparent touch panel used for operation of various kinds of electronic equipment.

2. Background Art

In recent years, electronic equipment has had more advanced and diversified functions. Accordingly, there is an increasing number of such equipment in which characters, marks, and icons displayed on display elements of liquid crystal are recognized and selected through a transparent touch panel attached in front of the display elements so that individual functions of the equipment are switched.

Such a conventional touch panel is described with reference to FIGS. 5 and 6. To facilitate understanding of a structure thereof, the dimension in the direction of the thickness is enlarged in the drawings.

FIG. 5 is a sectional view of a conventional transparent touch panel. On the bottom surface of optically transparent upper substrate 21 made of polyethylene terephthalate film, polycarbonate film, or the like, optically transparent first conductive layer 22 made of indium tin oxide, tin oxide, or other materials, is formed by vacuum sputtering or other methods. On the other hand, on the top surface of optically transparent lower substrate 23 made of polyethylene terephthalate film, glass, acryl or the like, optically transparent lower conductive layer 24 like first conductive layer 22 is formed. On the top surface of lower conductive layer 24, a plurality of dot spacers 25 made of an insulating resin, e.g. epoxy and silicon, are formed at regular intervals to hold a predetermined space between first conductive layer 22 and lower conductive layer 24.

A pair of upper electrodes 26 extends from both edges of first conductive layer 22. A pair of lower electrodes 27 extends from both edges of lower conductive layer 24 in a direction orthogonal to upper electrodes 26. Each electrode is made by printing paste made of silver, carbon, or other materials. The ends of each lower electrode 27 extend to the edges of lower substrate 23. Each of upper electrodes 26 is wired to the top surface of lower substrate 23 via a through-hole (not shown) filled with conductive agent, and the ends of each upper electrode 26 extend to the edges of lower substrate 23 in parallel with lower electrode 27.

Moreover, the outer peripheries of upper substrate 21 and lower substrate 23 are bonded by a frame-shaped spacer (not shown) having an adhesive agent applied to top and bottom surfaces thereof so that first conductive layer 22 is opposed to lower conductive layer 24 with a predetermined space held therebetween. The edges of upper substrate 21 and lower substrate 23 sandwich wiring board 29 that is made of polyethylene terephthalate film, polycarbonate film, or the like and has a plurality of wiring patterns 28 made of copper or other materials formed on the bottom surface.

At the ends of wiring patterns 28, joints 28A plated with nickel, gold, or other materials are formed. Filled between joints 28A and upper electrode 26 or lower electrode 27 is anisotropic conductive adhesive (hereinafter referred to as "adhesive") 30 containing conductive grains 30B made of carbon dispersed in synthetic resin 30A, e.g. polyester and chloroprene rubber. In other words, as shown in a partially sectional view of FIG. 6, joints 28A at the ends of wiring patterns 28 and upper electrode 26 or lower electrode 27 are bonded by synthetic resin 30A in adhesive 30. They are also electrically connected by the top and bottom surfaces of conductive grains 30B.

After wiring board 29 is sandwiched between upper substrate 21 and lower substrate 23, joints 28A and upper electrode 27 or lower electrode 28 are bonded by hot-pressing adhesive 30 applied to the side of lower substrate 23 or wiring board 29. As a result, as shown in FIG. 6, the top surfaces of conductive grains 30B are pressed by joints 28A plated with a relatively hard metal, such as nickel and gold, and the bottom surfaces are substantially embedded into relatively soft upper electrode 26 or lower electrode layer 27.

In this structure, wiring patterns 28 on wiring board 29 are coupled to a detecting circuit (not shown) of electronic equipment via a connector or by soldering. Depressing the top surface of upper substrate 21 with a finger, pen, or the like flexes upper substrate 21 and brings first conductive layer 22 in the depressed position into contact with lower conductive layer 24. Then, the detecting circuit sequentially applies voltages to two pairs of upper electrode 26 and lower electrode 27. According to the resistance ratio of these two pairs of electrodes, the detecting circuit detects the depressed position. A transparent touch panel structured to sandwich a wiring board between two transparent substrates in this manner is disclosed in Japanese Patent Application Unexamined Publication No. H04-12421, for example.

Because the bottom surfaces of conductive grains 30B are substantially embedded into upper electrode 26 or lower electrode 27, wiring board 29 and upper substrate 21 or lower substrate 23 are connected in a stable manner. However, the top surfaces of conductive grains 30B are only in contact with joints 28A. For this reason, when a transparent touch panel is used at high ambient temperatures and synthetic resin 30A softens, the connection of this portion is not ensured. Thus, electrical connection between wiring pattern 28 and upper electrode 26 or lower electrode 27 is likely to be unstable.

SUMMARY OF THE INVENTION

In a touch panel of the present invention, connecting layers are formed on the ends of wiring patterns on a wiring board. Via the connecting layers, the wiring patterns and a first electrode on a transparent first substrate or a second electrode on a transparent second substrate are connected by an anisotropic conductive adhesive. In this structure, relatively soft connecting layers are formed at the ends of wiring patterns. Thus, the components are connected so that conductive grains in the anisotropic conductive adhesive are substantially embedded into the connecting layers, in addition to the first electrode or second electrode. This connection can provide a transparent touch panel that has the first and second substrates securely bonded to the wiring board and stable electrical connection.

DETAILED DESCRIPTION OF THE INVENTION

Figure 1:
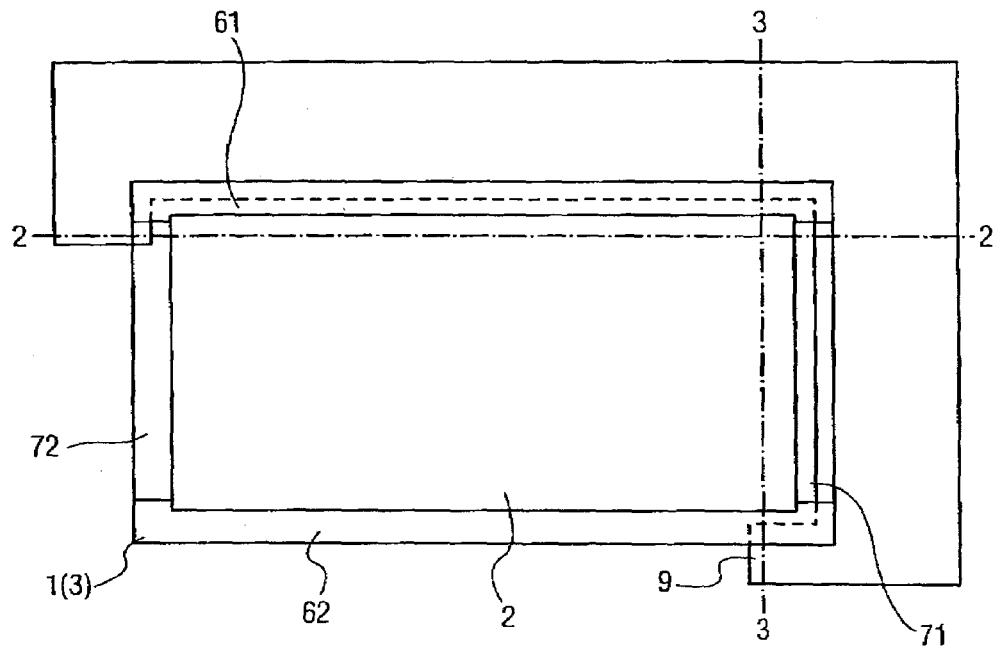
FIG. 1 is a perspective top view of a transparent touch panel in accordance with an exemplary embodiment of the present invention.
Figure 2:
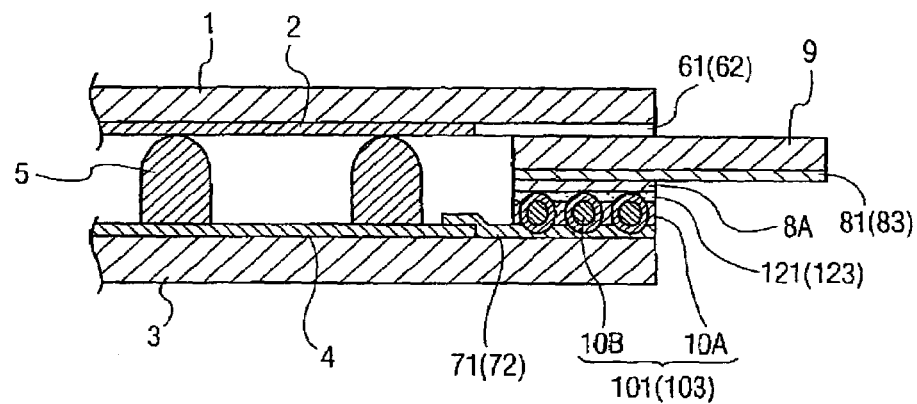
FIGS. 2 and 3 are sectional views of the transparent touch panel of FIG. 1.
Figure 3:
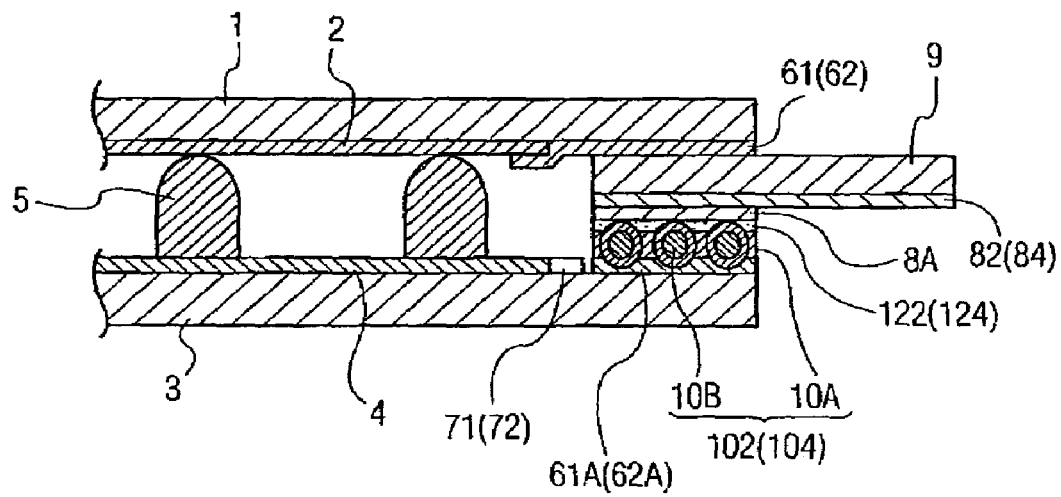

FIG. 1 is a perspective top view of a transparent touch panel in accordance with an exemplary embodiment of the present invention. FIGS. 2 and 3 are sectional views of the transparent touch panel of FIG. 1 taken along lines 2—2 and 3—3, respectively.

On the bottom surface of optically transparent first substrate 1 approximately 150 to 200 $\mu$m thick that is made of polyethylene terephthalate film, polycarbonate film, or the like, optically transparent first conductive layer 2 made of indium tin oxide, tin oxide, or other materials, is formed by vacuum sputtering or other methods. On the other hand, on the top surface of optically transparent second substrate 3 made of polyethylene terephthalate film, glass, acryl or the like, optically transparent second conductive layer 4 like first conductive layer 2 is formed. On the top surface of second conductive layer 4, a plurality of dot spacers 5 made of an insulating resin, e.g. epoxy and silicon, are formed at regular intervals to hold a predetermined space between first conductive layer 2 and second conductive layer 4.

A pair of upper electrodes (first and third electrodes) 61 and 62 extends from both edges of first conductive layer 2. A pair of lower electrodes (second and fourth electrodes) 71 and 72 extends from both edges of second conductive layer 4 in a direction orthogonal to upper electrodes 61 and 62. Each electrode is made by printing paste containing silver, carbon, or other materials dispersed in polyester or epoxy. The ends of lower electrodes 71 and 72 extend to the edges of second substrate 3. Upper electrodes 61 and 62 are connected to electrodes 61A and 62A on the top surface of second substrate 3 respectively via through-holes (not shown) filled with conductive agent, and the ends of upper electrodes 61A and 62A extend to the edges of second substrate 3 in parallel with lower electrodes 71 and 72. Electrodes 61 and 62 are opposed to each other. Electrodes 71 and 72 are opposed to each other.

Moreover, the outer peripheries of upper substrate 1 and lower substrate 3 are bonded by a frame-shaped spacer (not shown) having an adhesive agent applied to top and bottom surfaces thereof so that first conductive layer 2 is opposed to second conductive layer 4 with a predetermined space held therebetween. The edges of first substrate 1 and second substrate 3 sandwich wiring board 9 that is made of polyethylene terephthalate film, polycarbonate film, or the like and has wiring patterns (hereinafter referred to as "patterns") 81 through 84 made of copper or other materials formed on the bottom surface.

At the ends of wiring patterns 81 through 84 on wiring board 9, joints 8A plated with nickel, gold, or other materials are formed. Printed on joints 8A are connecting layers 121 through 124 made of a resin, e.g. polyurethane and polyester, containing silver powder dispersed therein. Between connecting layer 121 and lower electrode 71, connecting layer 122 and upper electrode 61, connecting layer 123 and lower electrode 72, and connecting layer 124 and upper electrode 62, anisotropic conductive adhesive layers (hereinafter referred to as "adhesive layers") 101 through 104 are formed respectively. The adhesive layers contain conductive grains 10B made of nickel, resin, or other materials plated with gold that are dispersed in synthetic resin 10A, e.g. polyester, and chloroprene rubber. In other words, each of connecting layers 121 through 124 and each of electrodes 61A, 62A and lower electrodes 71, 72 are bonded by synthetic resin 10A in adhesive layers 101 through 104. Each of connecting layers 121 through 124 is also electrically coupled to each of electrodes 61A, 62A and lower electrodes 71, 72 by conductive grains 10B with the top surfaces thereof in contact with each of the connecting layers and the bottom surfaces thereof in contact with each of electrodes 61A, 62A and lower electrodes 71, 72.

Figure 4:
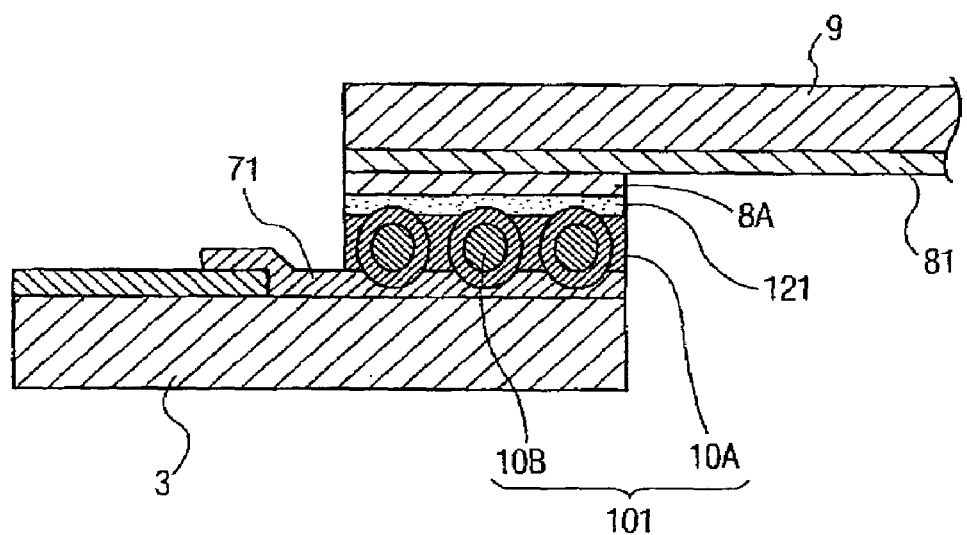
FIG. 4 is a partially enlarged view of FIG. 2.
Figure 5:
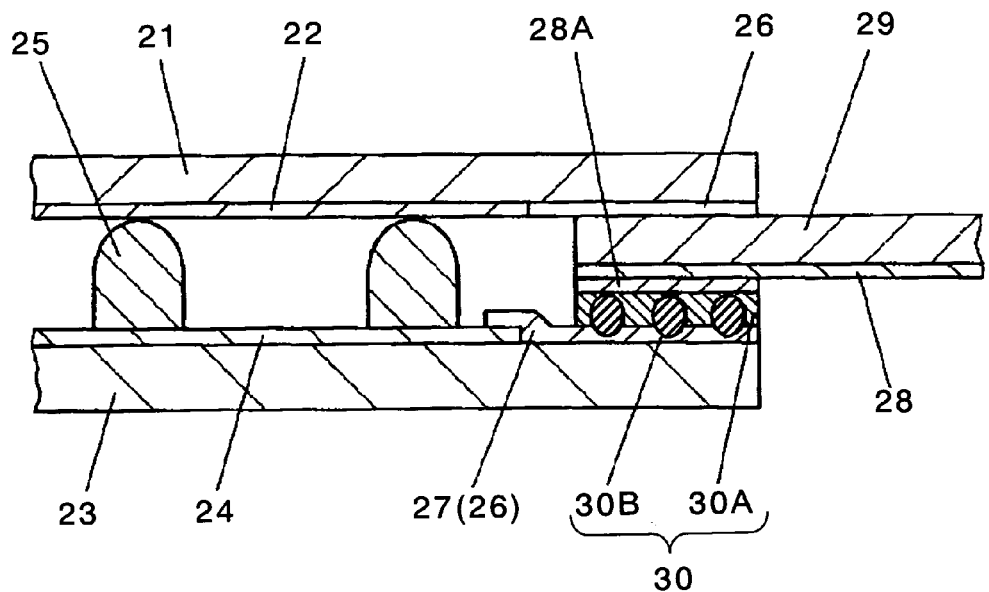
FIG. 5 is a sectional view of a conventional transparent touch panel.
Figure 6:
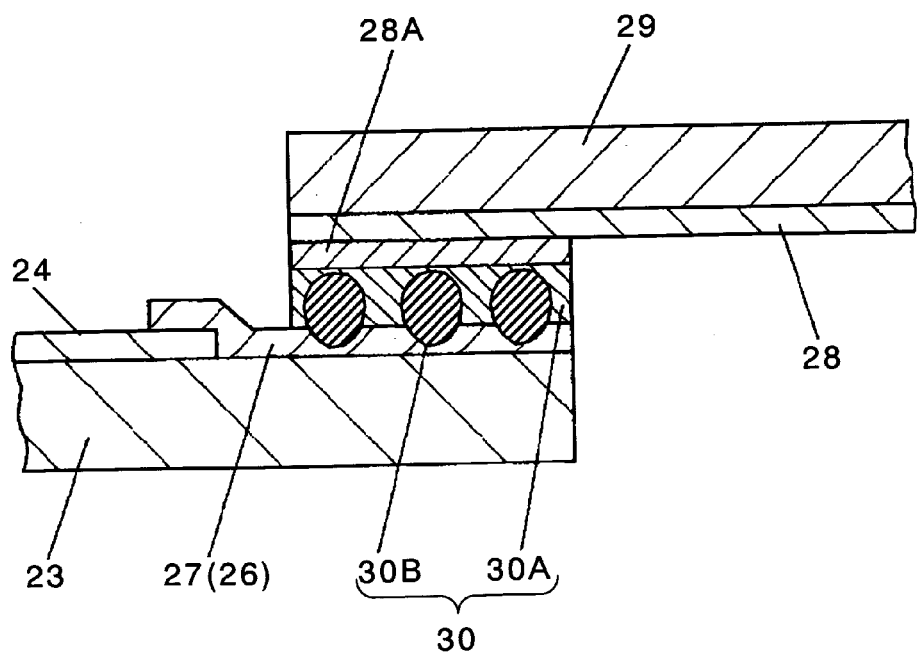
FIG. 6 is a partially enlarged view of FIG. 5.

FIG. 4 shows a portion in which pattern 81 and lower electrode 71 are coupled with each other, as an example. This structure is the same for lower electrode 72, and electrodes 61A and 62A. A simplified description is provided of the connection of pattern 81 and lower electrode 71.

After wiring board 9 is sandwiched between the edges of first substrate 1 and second substrate 3, connecting layer 121 and lower electrode 71 are bonded by hot-pressing an anisotropic conductive adhesive applied to second substrate 3 or wiring board 9, and using this adhesive layer 101. As a result, like the prior art, the bottom surfaces of conductive grains 10B are substantially embedded into relatively soft lower electrode 71. Additionally, the top surfaces of conductive grains 10A are substantially embedded into relatively soft connecting layer 121 provided on pattern 81.

In this structure, wiring patterns 81 through 84 on wiring board 9 are coupled to a detecting circuit (not shown) of electronic equipment via a connector or by soldering. Depressing the top surface of first substrate 1 with a finger, pen, or the like flexes first substrate 1 and brings first conductive layer 2 in the depressed position into contact with second conductive layer 4. Then, the detecting circuit applies voltages to upper electrode 61 and lower electrode 71, and upper electrode 62 and lower electrode 72 sequentially via patterns 81 through 84. According to the resistance ratio of these two pairs of electrodes, the detecting circuit detects the depressed position.

As described above, conductive grains 10B in adhesive layers 101 through 104 that connect patterns 81 through 84 to electrodes 61A, 62A and lower electrodes 71, 72 respectively are substantially embedded in the connecting layers and one of the upper and lower electrodes on both of the top and bottom surfaces thereof. For this reason, the transparent touch panel can be used at high ambient temperatures. Moreover, even when synthetic resin 10A softens, electrical connection can be ensured.

As described above, in this embodiment, relatively soft connecting layers 121 through 124 made of a synthetic resin containing a conductive metal powder dispersed therein are printed on the ends of patterns 81 through 84 to which electrodes 61A, 62A and lower electrodes 71, 72 are to be bonded respectively. In a thus structured transparent touch panel, conductive grains 10B are substantially embedded into one of connecting layers 121 through 124, in addition to one of electrodes 61A, 62A and lower electrodes 71, 72. This structure can provide a transparent touch panel that ensures bonding of substrate 1 and wiring board 9, and substrate 3 and wiring board 9, and stable electrical connection.

Moreover, forming connecting layers 121 through 124 by printing polyurethane resin containing silver powder dispersed therein increases elasticity and flexibility of connecting layers 121 through 124, thus further ensuring bonding of the electrodes and the wiring board. Further, use of silver powder as a conductive metal powder allows production of a transparent touch panel relatively less expensive.

Connecting layers 121 through 124 can be formed using resin, such as polyester. However, in comparison with polyester resin having ester linkage, polyurethane resin has urethane linkage, and thus a cross-linked structure. For this reason, use of polyurethane resin in connecting layers 121 through 124 is preferable. This increases elasticity, flexibility, and adherence of connecting layers 121 through 124, thus further ensuring bonding.

In the above description, connecting layers 121 through 124 are printed on joints 8A plated with nickel, gold, or other materials, at the ends of patterns 81 through 84. Because connecting layers 121 through 124 include highly conductive silver powder, connecting layers 121 through 124 can be printed directly on the ends of patterns 81 through 84 made of copper or other materials, without joints 8A.

Additionally, the ends of lower electrodes 71, 72 and electrodes 61A, 62A are extended to the edges of second substrate 3 in parallel with each other. To these electrodes, the ends of patterns 81 through 84 on the bottom surface of wiring board 9 are bonded. As another structure, upper electrodes 61 and 62 can be extended to an edge of first substrate 1 and lower electrodes 71 and 72 to an edge of second substrate 3 to bond to wiring board 9 having patterns 81 through 84 formed on the top and bottom surfaces thereof.

In the above description, patterns 81 through 84 are provided on the bottom surface of wiring board 9, and pattern 81 through 84 are respectively bonded with electrodes 61A, 62A, 61, 62, 71, and 72 on second substrate 3. However, patterns can be provided on the top surface of wiring board 9 and the patterns and electrodes can be bonded on first substrate 1.

Each of patterns 81 through 84 and each of electrodes 61A, 62A, 71, and 72 are respectively connected via the connection layer and the adhesive layer. However, when temperature distribution occurs in a transparent touch panel, connection layers are provided only in positions at high temperatures.

Incidentally, in the above description, the detecting circuit not shown detects a two-dimensional position depressed in the touch panel. When a position in one direction is detected, the depressed position can be detected by the resistance between one upper electrode and one lower electrode. Thus, only one upper electrode and one lower electrode are enough.

A transparent touch panel of the present invention ensures bonding, realizes stable electrical connection, and is useful for operation of various kinds of electronic equipment.

What is claimed is:

1. A transparent touch panel comprising:
   a first optically transparent substrate having a first conductive layer and a first electrode extending from an edge of the first conductive layer;
   a second optically transparent substrate opposed to the first substrate, and having a second conductive layer opposed to the first conductive layer with a predetermined space held therebetween, and a second electrode extending from an edge of the second conductive layer in a direction orthogonal to the first electrode;
   a wiring board having first and second wiring patterns formed on a surface thereof
   a first anisotropic conductive adhesive layer for connecting the first wiring pattern and the first electrode, the first conductive adhesive layer consisting essentially of a first resin and first conductive grains in the first resin;
   a second anisotropic conductive adhesive layer for connecting the second wiring pattern and the second electrode, the second conductive adhesive layer consisting essentially of a second resin and second conductive grains in the second resin; and
   at least one of:
   a first connecting layer formed on an end of the first wiring pattern, containing a third resin and a first conductive metal powder dispersed in the third resin, and existing between the first wiring pattern and the first electrode; and
   a second connecting layer formed on an end of the second wiring pattern, containing a fourth resin and a second conductive metal powder dispersed in the fourth resin, and existing between the second wiring pattern and the second electrode.

2. The transparent touch panel of claim 1, wherein the wiring board further comprises third and forth wiring patterns formed on a surface thereof;
   the first substrate has a third electrode extending from the edge of the first conductive layer in a position opposed to the first electrode;
   the second substrate has a fourth electrode extending from the edge of the second conductive layer in a position opposed to the second electrode;
   the touch panel further comprising:
   a third anisotropic conductive adhesive layer for connecting the third wiring pattern and the third electrode, the third conductive adhesive layer consisting essentially of a fifth resin and third conductive grains in the fifth resin;
   a fourth anisotropic conductive adhesive layer for connecting the fourth wiring pattern and the fourth electrode, the fourth conductive adhesive layer consisting essentially of a sixth resin and fourth conductive grains in the sixth resin; and
   at least one of:
   a third connecting layer formed on an end of the third wiring pattern, containing a seventh resin and a fourth conductive metal powder dispersed in the resin, and existing between the third wiring pattern and the third electrode; and
   a fourth connecting layer formed on an end of the fourth wiring pattern, containing an eighth resin and a fifth conductive metal powder dispersed in the eighth resin, and existing between the fourth wiring pattern and the fourth electrode.

3. The transparent touch panel of claim 2, wherein the fifth resin and the sixth resin are polyurethane resins.

4. The transparent touch panel of claim 2, wherein the third conductive metal powder is silver powder and the fourth conductive metal powder is silver powder.

5. The transparent touch panel of claim 2, wherein at least one of the third conductive grains and the fourth conductive grains is embedded into at least one of the third connecting layer and the fourth connecting layer.

6. The transparent touch panel of claim 1, wherein the wiring board is sandwiched between the first substrate and the second substrate.

7. The transparent touch panel of claim 1, wherein the third resin and the fourth resin are polyurethane resins.

8. The transparent touch panel of claim 1, wherein the first conductive metal powder is silver powder and the second conductive metal powder is silver powder.

9. The transparent touch panel of claim 1, wherein at least one of the first conductive grains and the second conductive grains is embedded into at least one of the first connecting layer and the second connecting layer.

10. The transparent touch panel of claim 9, wherein the third resin and the fourth resin are polyurethane resins, and the first conductive metal powder is silver powder and the second conductive metal powder is silver powder.

* * * * *